United States Patent [19]

Murase

[11] Patent Number: 4,751,418

[45] Date of Patent: Jun. 14, 1988

[54] ELECTROACOUSTIC TRANSDUCER

[75] Inventor: Tadashi Murase, Gifu, Japan

[73] Assignee: Nippon Colin, Co., Ltd, Aichi, Japan

[21] Appl. No.: 909,323

[22] Filed: Sep. 19, 1986

[30] Foreign Application Priority Data

Sep. 20, 1985 [JP] Japan .......................... 60-144743[U]

[51] Int. Cl.⁴ ............................................ H01L 41/08

[52] U.S. Cl. .................................... 310/319; 310/324; 381/190

[58] Field of Search ................................ 310/317-319, 310/324; 381/190

[56] References Cited

U.S. PATENT DOCUMENTS

| | | | |
|---|---|---|---|
| 3,749,946 | 7/1973 | Von Rüti | 310/319 |
| 4,328,441 | 5/1982 | Kroeger, Jr. et al. | 310/319 |
| 4,406,965 | 9/1983 | Ljung | 310/319 |
| 4,451,710 | 5/1984 | Taylor et al. | 310/319 X |
| 4,471,257 | 9/1984 | Kleinshmidt | 310/319 X |

*Primary Examiner*—Mark O. Budd
*Attorney, Agent, or Firm*—Parkhurst & Oliff

[57] ABSTRACT

An electroacoustic transducer having a piezoelectric element disposed on a diaphragm for converting an acoustic signal to an electric signal, and a differential amplifier for amplifying the electric signal. The piezoelectric element is connected between one of two input lines connected to the differential amplifier, and a reference voltage source. A load having substantially the same impedance as the piezoelectric element is connected between the reference voltage source and the other input line. The load may consist of another piezoelectric element.

4 Claims, 1 Drawing Sheet

ELECTROACOUSTIC TRANSDUCER

BACKGROUND OF THE INVENTION

1. Field of the Invention

The present invention relates to improvements in an electroacoustic transducer which incorporates a piezoelectric element disposed on a diaphragm for converting sound waves or acoustical signals to electric waves or signals, and an amplifier for amplifying the electric signals.

2. Discussion of the Prior Art

As an electroacoustic device such as a microphone, there is known an electroacoustic transducer which uses a piezoelectric element disposed on a diaphragm to convert acoustical signals to electric signals, and an amplifier for amplifying the obtained electric signals. An example of this type of electroacoustic transducer is shown in FIG. 3, wherein one electrode 14 on one of opposite surfaces of a piezoelectric element 12 disposed on a diaphragm 10 is connected through an input line 16 to an amplifier 18, while the other electrode 20 on the other surface of the element 12 is connected to an earth 22. Oscillation of the diaphragm 10 by sound waves causes the piezoelectric element 12 to produce an electric potential which varies with the amplidude of the oscillation of the diaphragm. As a result, an electric signal representative of a difference between the produced electric potential and a reference potential of the earth 22 is applied to the amplifier 18, which amplifies the electric signal by a predetermined amplification factor. The amplified signal is delivered from an output terminal 24 of the device.

The use of piezoelectric ceramics as a piezoelectric element has been proposed, for increased sensitivity and freedom of design and for reduced weight of the element. Examples of the piezoelectric ceramics include $BaTiO_3$, PZT ($PbZrO_3$-$PbTiO_3$), and a three-element mixture consisting of PZT and a compound perovskite composition. For instance, the use of these piezoelectric ceramics makes it possible to detect very weak sound waves such as heartbeat sounds, or minimize the thickness and weight of a detecting portion disposed on the diaphragm of an electroacoustic transducer. Thus, the piezoelectric ceramic materials have various advantages.

However, since a piezoelectric element made of such piezoelectric materials has an extremely high output impedance, it is necessary to use on amplifier which has an accordingly high input impedance. Therefore, the electroacoustic transducer using such high-impedance piezoelectric element and amplifier tends to easily pick up noises induced in the input line. A known method to avoid this tendency is to use shielded wires as the input line. This method is not completely satisfactory in preventing the pickup of the induced noises.

In the meantime, it is known to use a differential amplifier as means for removing the induced noises from the electric signals. An example of an arrangement using such a differential amplifier is shown in FIG. 4, wherein a pair of electrodes 32, 34 on opposite surfaces of a piezoelectric element 30 are connected through respective input lines 36, 38 to a pair of input terminals of a differential amplifier 40. In this arrangement, noises of equal levels induced in the two input lines 36, 38 may be offset or cancelled by each other by the differential amplifier 40.

In this case, however, there is no fixed reference for the electric potential generated by the piezoelectric element 30, and consequently the level of the electric signal applied to the differential amplifier 40 through the input lines 36, 38 may be cause to flucture by the induced noises or other factors. Thus, there exists a possibility that the level of the input signals applied to the differential amplifier 40 may not be held within the predetermined range of the amplifier, causing distortion of the output signal. To overcome this inconvenience, one of the two input lines 36, 38 must be connected to a reference potential such as an earth. This arrangement is substantially the same as the circuit shown in FIG. 3. Therefore, it is not possible to obtain the intended effect of the arrangement of FIG. 4 of offsetting the induced noises by differential amplification.

SUMMARY OF THE INVENTION

It is accordingly an object of the present invention to provide an electroacoustic transducer which is free from the drawbacks experienced in the prior art arrangements as shown in FIGS. 3 and 4.

According to the present invention, there is provided an electroacoustic transducer having a piezoelectric element disposed on a diaphragm for converting an acoustic signal to an electric signal, and an amplifier for amplifying the electric signal, and wherein: a differential amplifier having a pair of input terminals is provided as the amplifier; a pair of input lines are connected to the pair of input terminals of the differential amplifier, respectively, such that the piezoelectric element is connected to one of the two input terminals of the differential amplifier through one of the pair of input lines; a reference voltage source is connected to the piezoelectric element which is connected to the above-indicated one input line; and a load is connected between the reference voltage source and the other input line which is connected to the other input terminal of the differential amplifier, the load having substantially the same impedance as the piezoelectric element.

In the electroacoustic transducer constructed according to the invention as described above, the same amounts of noises are induced in the two input lines since a load having substantially the same impedance as the piezoelectric element is provided between the reference voltage source and the input line which is not connected to the piezoelectric element. As a result, the noises mixed in the electric signals applied to the input terminals of the differential amplifier can be offset by each other when the electric signals are amplified by the differential amplifier. Thus, the induced noises may be eliminated from the electric signal output representative of the acoustic signal. Since the piezoelectric element and the load are both connected to the reference voltage source, the electric signal waveforms applied to the differential amplifier through the respective input lines will not be caused to flucture, whereby the output of the differential amplifier respresentative of the acoustic signal will not to distorted.

While the load may consist of an equivalent circuit including a capacitor and/or a resistor equivalent to the piezoelectric element, the load may also consist of a second piezoelectric element having the same piezoelectric effect as the first piezoelectric element connected to the above-indicated one input line. In this latter case, the first piezoelectric element has a first electrode connected to the above-indicated one input line and a second electrode connected to the reference voltage source. The second piezoelectric element has a third electrode connected to the reference voltage source and a fourth electrode connected to the other input line. The third electrode generates an electric potential of the same polarity as that of the first electrode of the first piezoelectric element upon generation of said acoustic signal.

BRIEF DESCRIPTION OF THE DRAWINGS

The foregoing and optical objects, features and advantages of the present invention will be better understood by reading the following detailed description of preferred embodiments of the invention, when taken in connection with the accompanying drawings, in which.

DETAILED DESCRIPTION OF THE PREFERRED EMBODIMENTS

The preferred embodiments of the invention will now be described by reference to the accompanying drawings.

Figure 1:
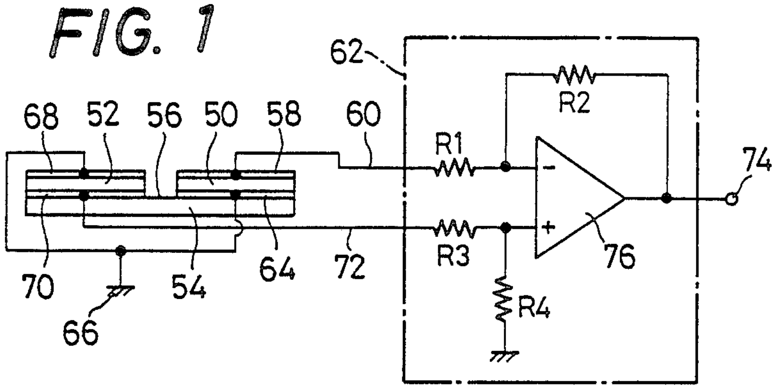
FIG. 1 is a circuit diagram of one embodiment of the invention in the form of a microphone adapted to detect heartbeat sounds.

Referring to FIG. 1, which shows an electric circuit of a piezoelectric microphone constructed according to the invention for detecting heartbeat sounds, reference numerals 50 and 52 designate planar piezoelectric elements made of a suitabale piezoelectric ceramic material such as PZT. These two piezoelectric elements 50, 52 are disposed on one of the opposing surfaces of a diaphragm 54. These two piezoelectric elements 50, 52, which have completely the same piezoelectric characteristic, are adapted to respond to vibrations of the diaphragm 54 produced by sound waves due to beats or pulsations of the heart of a living body, and produce an electric potential whose magnitude varies with that of the vibrations.

An electrode 58, one of two electrodes disposed on the opposing surfaces of the piezoelectric element 50 is connected through an input line 60 to one of two input terminals of a differential amplifier 62. The other electrode 64 is connected to an earth 66 which serves as a reference voltage source. Similarly, the other piezoelectric element 52 has two electrodes 68, 70. The electrode 68 generates an electric potential of the same polarity as that of the electrode 58 of the piezoelectric element 50, in response to vibrations of the diaphragm 54. This electrode 68 is connected to the earth 66. The other electrode 70 of the piezoelectric element 52 is connected through an input line 72 to the other input terminal of the differential amplifier 62. According to this arrangement, the two input terminals of the differential amplifier 62 receive electric signals, whose amplitude with respect to the reference voltage of the earth 66 is varied symmetrically with each other in opposite directions. The differential amplifier 62 produces an output which is proportional to a difference between the voltages applied to its two inputs. The output is delivered to an output terminal 74 of the piezoelectric microphone. The differential amplifier 62 consists of one operational amplifier 76, and a plurality of resistors R1 through R4.

Since the piezoelectric elements 50, 52 are made of a piezoelectric ceramic material, their output impedance is extremely high, and consequently the input impedance of the differential amplifier 62 must be correspondingly high. Therefore, the electric signals to be applied to the differential amplifier 62 through the input lines 60, 72 tend to easily contain induced noises. However, the same amounts of noises are induced in the two input lines. As a result, the noises mixed in the two inputs to the differential amplifier 62 may be offset or cancelled by each other through differential amplification of the two inputs by the differential amplifier 62.

Further, the electric signals generated by the piezoelectric elements 50, 52 will not fluctuate due to noises, because the electrodes 64 and 68 are grounded to the earth 66. Hence, the waveform of the electric signals will not be distorted beyond the predetermined range of the differential amplifer 62.

In the present embodiment, one of the two piezoelectric elements 50, 52 serves as a first piezoelectric element connected between the earth 66 and one of the input lines 60, 62, while the other piezoelectric element 50, 52 serves as a load in the form of a second piezoelectric element connected between the earth 66 and the other input line 60, 72.

Another embodiment of the invention will be described, referring to FIG. 2. In this embodiment, the piezoelectric element 52 of the preceding embodiment of FIG. 1 is replaced by an equivalent circuit 78 which serves as a load having the same impedance as the piezoelectric element 52. The equivalent circuit 78 consists of a capacitor and a resistor. In this modified embodiment, too, the same amounts of noises are inducted in the two input lines 60, 72, and therefore these noises may be offset by each other by the differential amplifier 62. It is noted that the electric signal applied to the differential amplifier 62 through the input line 72 represents the reference voltage of the earth 66, whereby the level of the output from the output terminal 74 is about a half of that in the preceding embodiment.

Although the present invention has been described in its preferred embodiments, it is to be understood that the invention may be otherwise embodied.

For example, while the illustrated embodiments take the form of a piezoelectric microphone for detecting sound waves of heartbeats, the concept of the invention may be embodied as other types of electroacoustic transducers or devices for converting acoustical signals (sound waves or vibrations) of not only the audible frequency band but also other frequency bands, to electric signals (electric waves).

While the piezoelectric elements 50, 52 used in the illustrated embodiments are made of a piezoelectric ceramic material such as PZT, other piezoelectric materials may be used.

The differential amplifier 62 employed in the illustrated embodiments consists of the operational amplifier 76 and the plurality of resistors R1–R4. However, the principle of the invention may be practiced with other differential amplifier arrangements. For instance, it is possible to use a differential amplifier which includes a plurality of operational amplifiers.

While the two piezoelectric elements 50, 52 of the first embodiment of FIG. 1 are disposed on one of the opposing surfaces of the diaphragm 54, these elements 50, 52 may be disposed on the respective opposing surfaces of the diaphragm 54, so as to sandwich the diaphragm 54.

Figure 2:
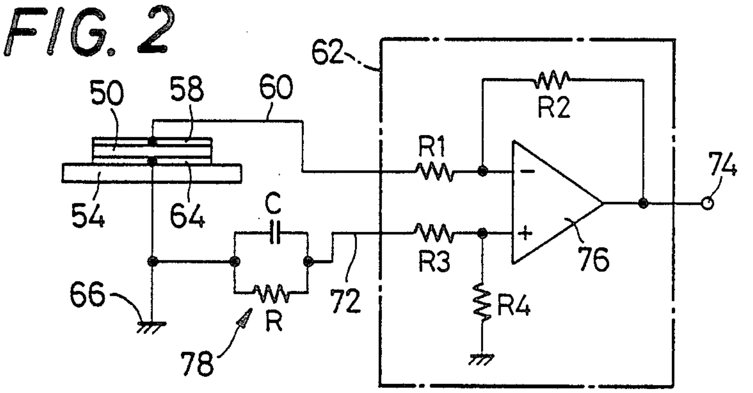
FIG. 2 is a circuit diagram of another embodiment of the invention.
Figure 3:
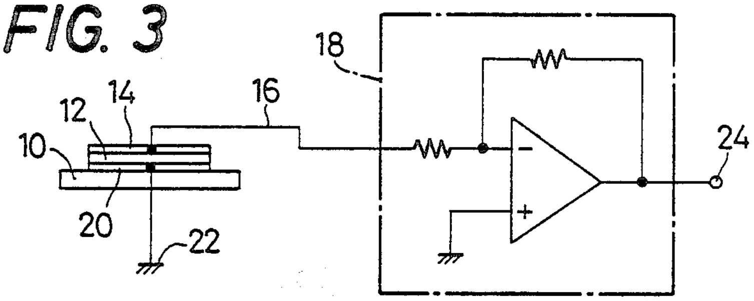
FIG. 3 is a circuit diagram of an example of a known electroacoustic transducer.
Figure 4:
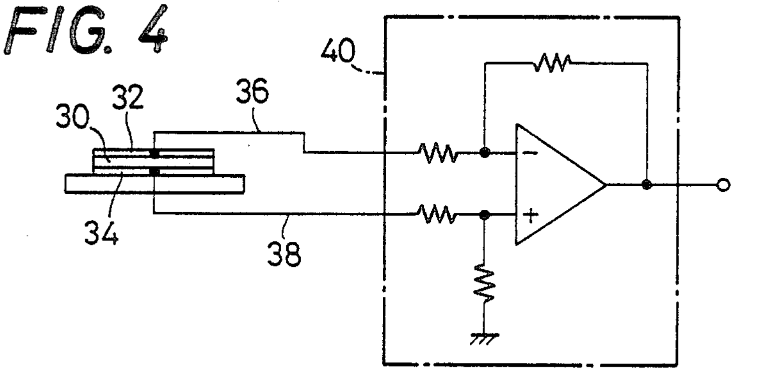
FIG. 4 is a circuit diagram of another known type of electroacoustic transducer adapted to eliminate induced noises by using a differential amplifier.

Further, it is not essential that the equivalent circuit 78 consisting of a capacitor and a resistor used in the second embodiment of FIG. 2 have exactly the same impedance as the piezoelectric element 50. The equivalent circuit 78 may consist of either one of the capacitor and the resistor.

It will be obvious that the invention may be embodied with other changes and improvements which may occur to those skilled in the art.

What is claimed is:

1. An electroacoustic transducer, comprising:

a diaphragm which is vibrated by sound waves for producing an acoustic signal;

a first piezoelectric element disposed on said diaphragm for converting said acoustic signal to an electric signal, said first piezoelectric element having a first electrode and a second electrode;

a differential amplifier for amplifying said electric signal, said differential amplifier having a pair of input terminals;

said first electrode being connected to first one of said input terminals;

a reference voltage source connected to said second electrode; and a second piezoelectric element separate from said first piezoelectric element, and disposed on said diaphragm, said second piezoelectric element having a third electrode connected to said reference voltage soure, and a fourth electrode connected to a second one of said input terminals, said second piezoelectric element having substantially the same impedance as said first piezoelectric element, and said third electrode generating an electric potential of the same polarity as that of said first electrode in response to generation of said acoustic signal.

2. An electroacoustic transducer according to claim 1, wherein said diaphragm is incorporated in a piezoelectric microphone.

3. An electroacoustic transducer according to claim 1, wherein said diaphragm is incorporated in a piezoelectric microphone adapted to detect sound waves of heartbeats of a living body.

4. A piezoelectric microphone comprising an electroacoustic transducer having;

a diaphragm which is vibrated by sound waves for producing an acoustic signal;

a first piezoelectric element disposed on said diaphragm for converting said acoustic signal to an electric signal, said first piezoelectric element having a first electrode and a second electrode;

a differential amplifier for amplifying said electric signal, said differential amplifier having a pair of input terminals;

said first electrode being connected to first one of said input terminals;

a reference voltage source connected to said second electrode; and a second piezoelectric element separated from said first piezoelectric element, and disposed on said diaphragm, said second piezoelectric element having a third electrode connected to said reference voltage source, and a fourth electrode connected to a second one of said input terminals said second piezoelectric element having substantially the same impedance as said first piezoelectric element, and said third electrode generating an electric potential of the same polarity as that of said first electrode in response to generation of said acoustic signal.

* * * * *